(12) United States Patent
Kim et al.

(10) Patent No.: US 7,545,092 B2
(45) Date of Patent: Jun. 9, 2009

(54) ORGANIC ELECTROLUMINESCENT DISPLAY DEVICE

(75) Inventors: Hak Su Kim, Seoul (KR); Hyo Dae Bae, Daegu (KR)

(73) Assignee: LG Display Co., Ltd., Seoul (KR)

( * ) Notice: Subject to any disclaimer, the term of this patent is extended or adjusted under 35 U.S.C. 154(b) by 562 days.

(21) Appl. No.: 11/289,644

(22) Filed: Nov. 30, 2005

(65) Prior Publication Data

US 2006/0119256 A1   Jun. 8, 2006

(30) Foreign Application Priority Data

Dec. 1, 2004   (KR) ...................... 10-2004-0100072
Dec. 16, 2004  (KR) ...................... 10-2004-0107430

(51) Int. Cl.
    *H01J 1/62*   (2006.01)
(52) U.S. Cl. ................ 313/504; 313/491; 313/494
(58) Field of Classification Search ......... 313/498–512; 315/169.1, 169.3; 428/690–691, 917; 438/26–29, 438/34, 82; 257/40, 72, 98–100, 642–643, 257/759; 427/66, 532–535, 539; 445/24–25
See application file for complete search history.

(56) References Cited

U.S. PATENT DOCUMENTS

2003/0038591 A1*  2/2003  Kim ........................... 313/504
2005/0140281 A1*  6/2005  Park .......................... 313/505
2006/0028124 A1*  2/2006  Chu et al. .................... 313/504

* cited by examiner

*Primary Examiner*—Peter J Macchiarolo
*Assistant Examiner*—Donald L Raleigh
(74) *Attorney, Agent, or Firm*—Morgan Lewis & Bockius LLP

(57) ABSTRACT

An organic electroluminescent (EL) display device is provided which can reduce a level of power consumption. The organic EL display device includes a plurality of anode columns formed on a substrate, each anode column having first and second anodes disposed adjacent to each other, with emitting areas of the first and second anodes being arranged alternately in a line; a plurality of walls intersecting the anode columns. A plurality of cathodes are formed between walls which intersect the anode columns to form two sub pixels. A plurality of secondary walls are formed between two adjacent walls, between the light emitting areas of the first and second anodes of each anode column. Each secondary wall may include a plurality of unit walls corresponding to one pixel with first, second and third sub pixels which emit different colored lights. Alternatively, each subsidiary wall may include a plurality of unit walls, with each unit wall corresponding to one of the first, second or third sub pixels.

39 Claims, 9 Drawing Sheets

ORGANIC ELECTROLUMINESCENT DISPLAY DEVICE

This application claims priority to Korean Patent Application Nos. 2004-100072 filed on Dec. 1, 2004 in Korea and 2004-107430 filed on Dec. 16, 2004 in Korea, the entirety of which are incorporated herein by reference.

BACKGROUND OF THE INVENTION

1. Field of the Invention

The invention relates to an organic electroluminescent display device, and more particularly, to an organic electroluminescent display device which is capable of reducing power consumption.

2. Description of the Related Art

In order to overcome various shortcomings of the cathode ray tube (CRT), various types of flat panel display devices having a reduced weight and size compared to that of a CRT have been developed. These flat panel display devices include liquid crystal display (LCD) devices, field emission display (FED) devices, plasma display panels (PDP), and organic electroluminescent (EL) display device.

The structure and manufacturing process associated with a PDP are relatively simple, and so a PDP is often used when a large size display surface is required. However, the light emitting efficiency and brightness of a PDP tend to be low and an enormous amount of power is consumed by the PDP.

LCD devices are mainly used with laptop computers, and demand for LCD devices has increased. However, it is difficult to use an LCD device for a large display surface, and power consumption is high due to backlight requirements. Additionally, light loss in an LCD device is high due to optical members such as a polarized light filter, a prism sheet, a diffusion sheet and the like which may be included in the LCD device, and the viewing angle associated with an LCD device is narrow.

Electroluminescent devices (hereinafter, referred to as "EL devices") can be either an organic EL device or an inorganic EL device based on the material which forms a light emitting layer of the device. As the EL device itself emits light, response time is short, light emitting efficiency and brightness are high, and viewing angle is wide when compared to other flat panel display devices. However, an inorganic EL device has a higher level of power consumption when compared to an organic EL device, high levels brightness cannot be obtained by the inorganic EL device, and various levels of R (red), G (green) and B (blue) light cannot be emitted. On the other hand, the organic EL device may be driven by a variety of levels of low direct current, has a rapid response time, and can obtain high brightness and emit various levels of R, G and B light, and so is well suited for the next generation of flat panel display devices.

FIG. 1 is a schematic view of a conventional organic EL display device.

The conventional organic EL display device includes an organic EL display panel 20 with anode columns DL1-DLm, cathodes SL1-SLn perpendicular to the anode columns DL1-DLm, and first and second organic EL diodes 10a and 10b formed at common sections of the anode columns DL1-DLm and the cathodes SL1-SLn. A non display area with a data pad 24 is connected to the anode columns DL1-DLm via data lines (not shown), and a scan pad 22 is connected to the cathodes SL1-SLn via scan lines (not shown). The data pad 24 and the scan pad 22 are connected to a tape carrier package (not shown) in which a data driving section (not shown) for generating a data signal and a scan driving section (not shown) for generating a scan signal are provided. A data signal transmitted from the data driving section is supplied to the anode columns DL1-DLm via the data pad 24 and the data lines, and a scan signal transmitted from the scan driving section is supplied to the cathodes SL1-SLn via the scan pad 22 and the scan lines.

Each anode column (for example, DL1) comprises first and second anodes DL1-1 and DL1-2 adjacent to each other, and each cathode (for example, SL1) is divided into first and second sub cathodes SL1-1 and SL1-2 spaced apart from each other as shown in FIG. 1. Accordingly, a scan signal supplied from the scan driving section to one of the cathodes (for example, SL1) is supplied simultaneously to the first and second sub cathodes SL1-1 and SL1-2.

In a first organic EL diode 10a, an anode electrode is connected to the first anode DL1-1 of the anode column DL1, and a cathode electrode is connected to the first sub cathode SL1-1 of the cathode SL1. In the second organic electroluminescent diode 10b, an anode electrode is connected to the second anode DL1-2 of the anode column DL1, and a cathode electrode is connected to the second sub cathode SL1-2 of the cathode SL1. Therefore, though the scan signal is supplied to the cathode SL1 from the scan driving section, the data driving section can drive the first and second organic EL diodes 10a and 10b independently. This operation is performed in all anode columns DL1-DLm and cathodes SL1-SLn.

When a negative scan signal is supplied to the cathodes SL1-SLn to which the cathode electrodes of the first and second organic electroluminescent diodes 10a and 10b are connected, and a positive data signal is supplied to the first anode (for example, DL1-1) of each anode column (for example, DL1) to which the anode electrode of the first organic EL diode 10a is connected and the second anode DL1-2 of each anode column to which the anode electrode of the second organic EL diode 10b is connected, the current flows based on a forward bias, and so the first and second organic EL diodes 10a and 10b emit light.

Each of the first and second organic EL diodes 10a and 10b is formed with a first EL cell R having red fluorescent material, a second EL cell G having green fluorescent material, and a third EL cell B having blue fluorescent material. Each organic EL diode corresponding to one pixel of the organic EL display device emits a color image for that pixel by combining the first EL cell R, the second EL cell G and the third EL cell B.

FIG. 2 is a detailed view of section "A" of FIG. 1. Simply for ease of discussion and illustration, only three (3) anode columns and one (1) cathode are shown in FIG. 2. As shown in FIG. 2, the cathode SL1 is positioned substantially perpendicular to the anode columns DL1, DL2, DL3, with a first EL cell R, a second cell G, and a third EL cell B formed at areas of the anode columns DL1, DL2, DL3 which correspond to the cathode SL1. Primary walls 8a and a secondary wall 8b are positioned parallel to the cathode SL1.

Each anode column (for example, DL1) adjacent first and second anodes DL1-1 and DL1-2, and a section of the cathode SL1 (that is, a section corresponding to the emitting area) is divided into first and second sub cathodes SL1-1 and SL1-2 separated from each other by the secondary wall 8b. Accordingly, two emitting light areas are formed at each area where an anode column (for example, DL1) and the cathode SL1 meet.

The primary walls 8a extend to a non-display, or non-emitting area, but the secondary wall 8b is formed only in the EL cell array area, or active region. After forming the walls 8a and 8b, organic emitting material is deposited through a mask on the EL cell array area of the substrate on which the walls 8a and 8b are formed, and so the first EL cell R, the second cell G and the third EL cell B are formed. Thereafter, the cathode SL1 is formed by depositing conductive material on an entire structure.

When a negative scan signal is supplied to the cathode SL1, i.e., the first and second sub cathodes SL1-1 and SL1-2, and a positive data signal is supplied to one anode (for example, DL1-1) of the anode column DL1 at the same time, the current flows to the cathode SL1 via the current path shown in FIG. 3 so as to emit light through a corresponding cell. In this type of organic EL display device, if the data current for driving the pixels in full white is applied to the first and second sub cathodes SL1 and SL1-2 through the anodes or if a relatively large data current is applied, the first and second sub cathodes SL1 and SL1-2 may not be able to withstand the load resulting from the supplied the current.

Since the scan signal is supplied to two sub cathodes SL1-1 and SL1-2 through the cathode SL1 formed at the non-emitting area, the number of cathodes formed may be half the number of sub cathodes so that each cathode has a larger width in the non-emitting area. This will decrease line resistance of each cathode SL1-SLn in the non-emitting area, thus decreasing power accordingly.

However, though the line resistance of the cathodes SL1-SLn is decreased, the line resistance of the first and second sub cathodes $SL_{n-1}$-$SL_{n-2}$ formed on the EL cell array area is not decreased, and so this method is limited in its ability to decrease power consumption of the organic EL device.

SUMMARY OF THE INVENTION

An object of the invention is to solve at least the above problems and/or disadvantages and to provide at least the advantages described hereinafter.

An object of the invention is to provide an organic electroluminescence display device which can reduce the power consumption.

To achieve these objects, in whole or in part, as embodied and broadly described herein, an organic electroluminescent display device in accordance with an embodiment of the invention includes a plurality of anode columns formed on a substrate, each anode column including first and second anodes to which each driving signal is supplied, the first and second anodes being disposed adjacent to each other, and emitting areas of the first and second anodes of each anode column being arranged alternatively in one line, a plurality of walls intersecting the anode columns, a plurality of cathodes, each cathode being formed between the walls and intersecting the light emitting areas of the first and second anodes of each anode column to form two sub pixels, and a plurality of subsidiary walls, each subsidiary wall being formed between two adjacent walls and placed between the light emitting areas of the first and second anodes of each anode column.

Each subsidiary wall may include a plurality of unit walls, each unit wall corresponds to one pixel consisted of first to third sub pixels which emit different colored lights. Each subsidiary wall may also include a plurality of unit walls, each unit wall corresponds to one of first to third sub pixels which emit different colored lights.

Additionally, each unit wall of each subsidiary wall may include an extension portion formed on at least one end thereof, and the extension portion of each unit wall is extended in parallel with the anode.

Further, the extension portion of each unit wall may be divided into first and second extension portions which are extended with a certain angle to the anode columns.

BRIEF DESCRIPTION OF THE DRAWINGS

The invention will be described in detail with reference to the following drawings in which like reference numerals refer to like elements, wherein:

FIG. 5b is a partial sectional view taken along line B-B in FIG. 5a;

FIG. 5c is a partial sectional view taken along line C-C in FIG. 5a;

FIG. 7b is a partial sectional view taken along line B-B in FIG. 7a;

DETAILED DESCRIPTION OF THE INVENTION

Figure 1:
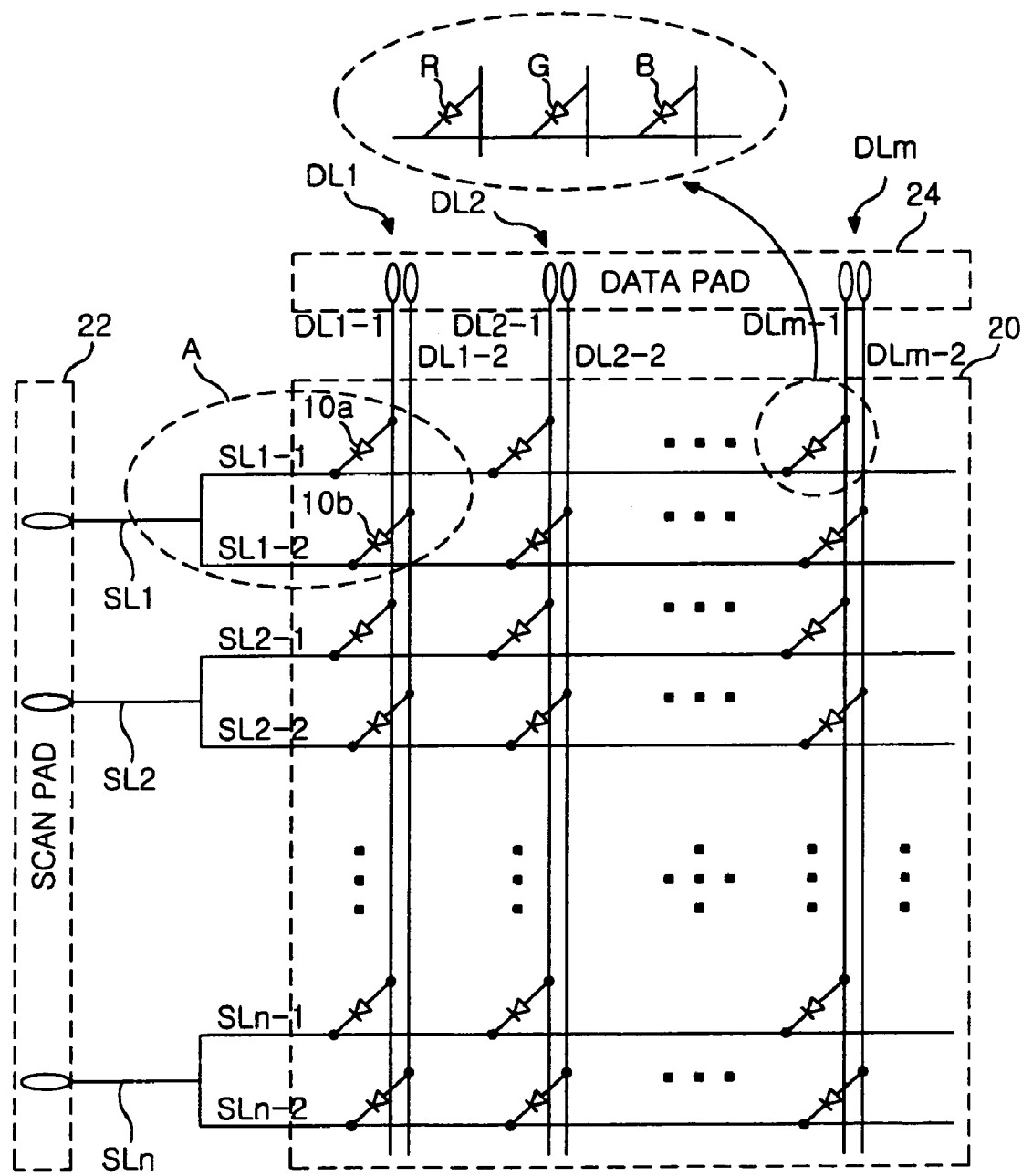
FIG. 1 is a schematic view of a conventional organic electroluminescent (EL) display device.
Figure 2:
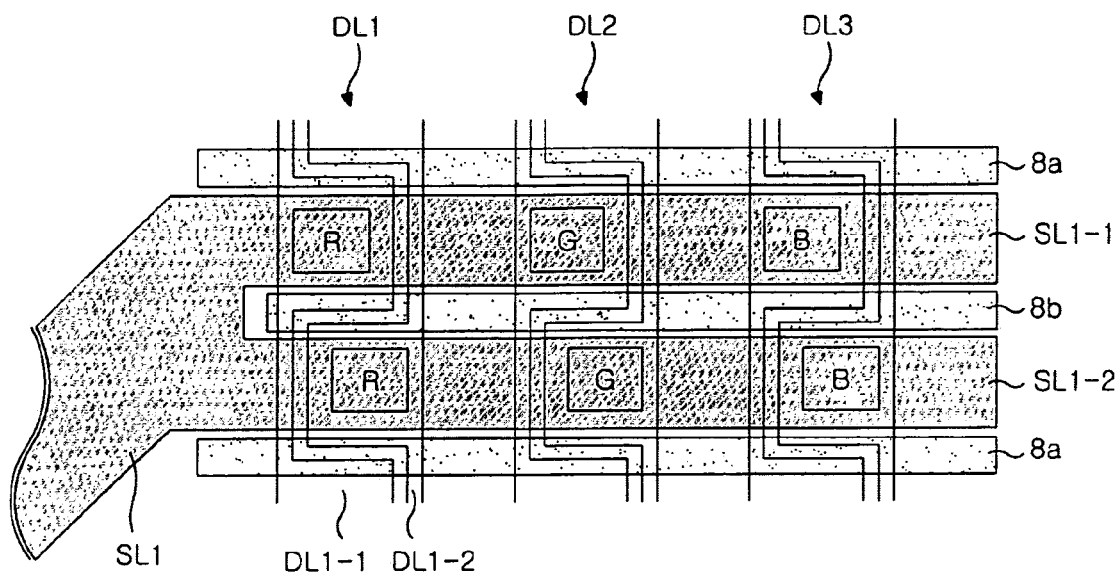
FIG. 2 is a detailed view of section "A" of FIG. 1.
Figure 3:
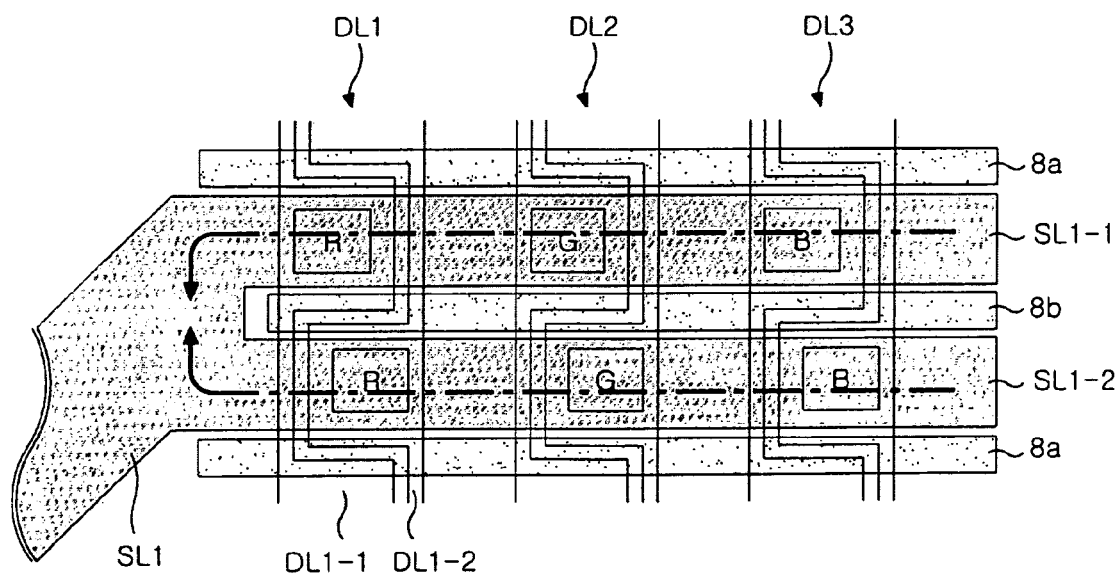
FIG. 3 illustrates a current path formed in the conventional organic EL display device shown in FIG. 1.
Figure 4:
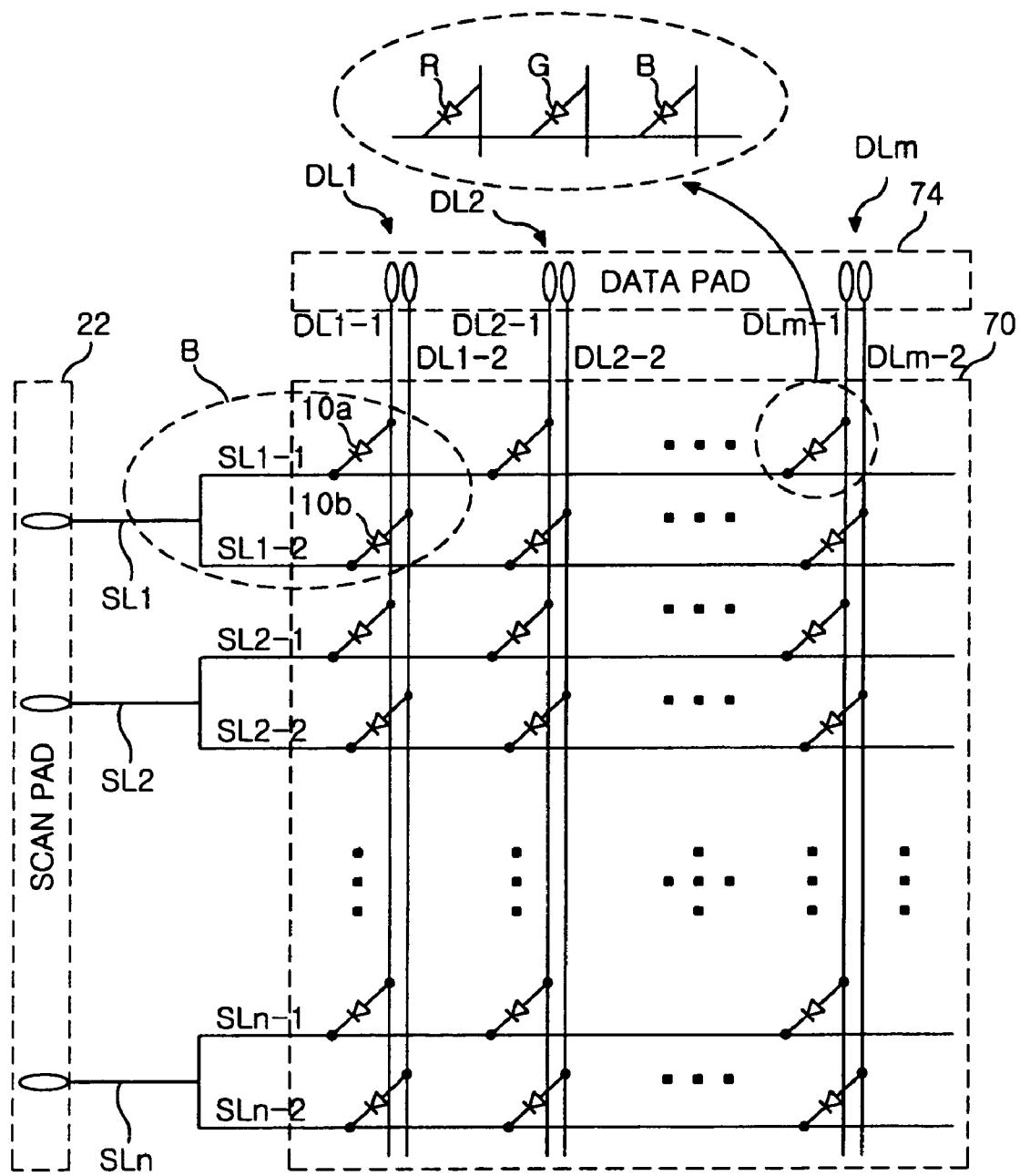
FIG. 4 is a schematic view of an organic EL display device, in accordance with an embodiment of the invention.

FIG. 4 is a schematic view of an organic electroluminescent (EL) display device in accordance with the embodiments of the invention. The structure of the organic EL display device shown in FIG. 4 is similar to that of the organic EL display device shown in FIG. 1, and thus a description of the similar sections of the two devices is omitted. Further, simply for ease of discussion and illustration, only three (3) anode columns and one (1) cathode are described and shown. However, it is well understood that a number of anode columns and cathodes in a particular display device are dependent on a number of different parameters, including, but not limited to, a size and quality of the display device.

Figure 5A:
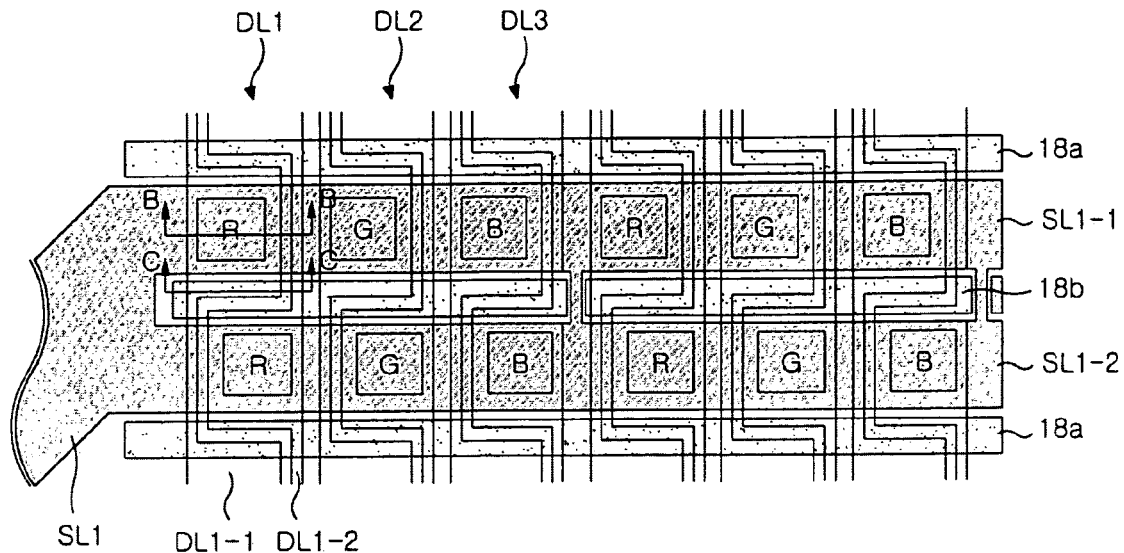
FIG. 5a is a detailed view of section "B" of FIG. 4, in accordance with an embodiment of the invention.

FIG. 5a is a detailed view of section "B" in FIG. 4, in accordance with a first embodiment of the invention. Section "B" of the organic EL display device includes anode columns DL1, DL2 and DL3, a cathode SL1 which crosses the anode columns DL1, DL2 and DL3, and primary walls 18a and a secondary wall 18b which cross the anode columns DL1, DL2 and DL3 and are positioned parallel to the cathode SL1.

A section of the cathode SL1 such as, for example, a section corresponding to the active region, is divided into first and second sub cathodes SL1-1 and SL1-2 by the secondary wall 18b, forming two individual cells at an area common to one anode column DL1 and one cathode SL1. Also, although the primary walls 18a may extend to a non-display, or non-emitting area, the secondary wall 18b may be formed on only a cell array area, or active region.

The secondary wall 18b which divides the cathode SL1 may actually be a plurality of unit secondary walls 18b, each unit secondary wall 18b corresponding to the first, second and third sub-pixels (EL cells) R, G and B, respectively, which make up one pixel. When constructed in this manner, the first and second sub cathodes SL1-1 and SL1-2 may be connected to each other, for example, at an area between adjacent unit secondary walls 18b. These areas which connect the first and second sub cathodes SL1-1 and SL1-2 cause the first and second sub cathodes SL1-1 and SL1-2 to have a larger surface area, thus reducing the resistance of the sub cathodes SL1-1 and SL1-2. Accordingly, the current supplied to the first and second sub cathodes SL1-1 and SL1-2 flows easily to the cathode SL1 by following the current path shown in FIG. 6 so that power consumption of the organic EL display device may be decreased.

Figure 5B:
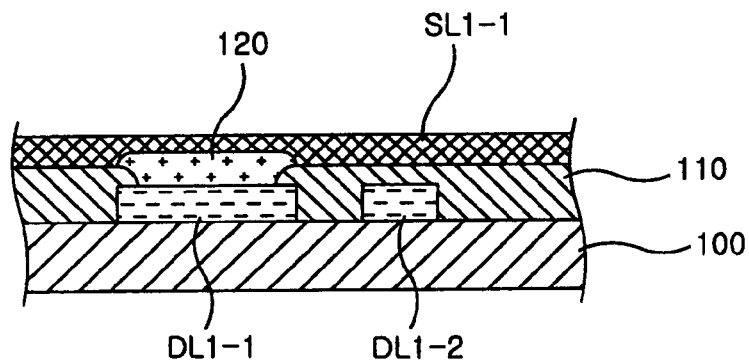
Figure 5C:
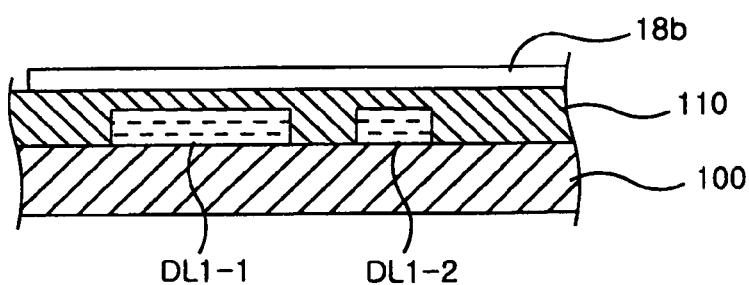

FIGS. 5b and 5c are partial sectional views taken along lines B-B and C-C, respectively, shown in FIG. 5a. FIGS. 5b and 5c provide an exemplary illustration of a relationship between an anode column DL1 with first and second anodes DL1-1 and DL1-2 formed on a substrate 100, and a first subcathode SL1-1 which crosses the anode column DL1. As shown in FIGS. 5b and 5c, an insulating layer 110 may be formed on the substrate 100 and portions of the anode column DL1, leaving at least a portion of the first anode DL1-1 exposed. An electroluminescent layer 120 may be formed on the exposed portion of the first anode DL1-1, and the cathode SL1-1 may be formed on the surface of the insulating layer 110 and the electroluminescent layer 120.

Figure 7A:
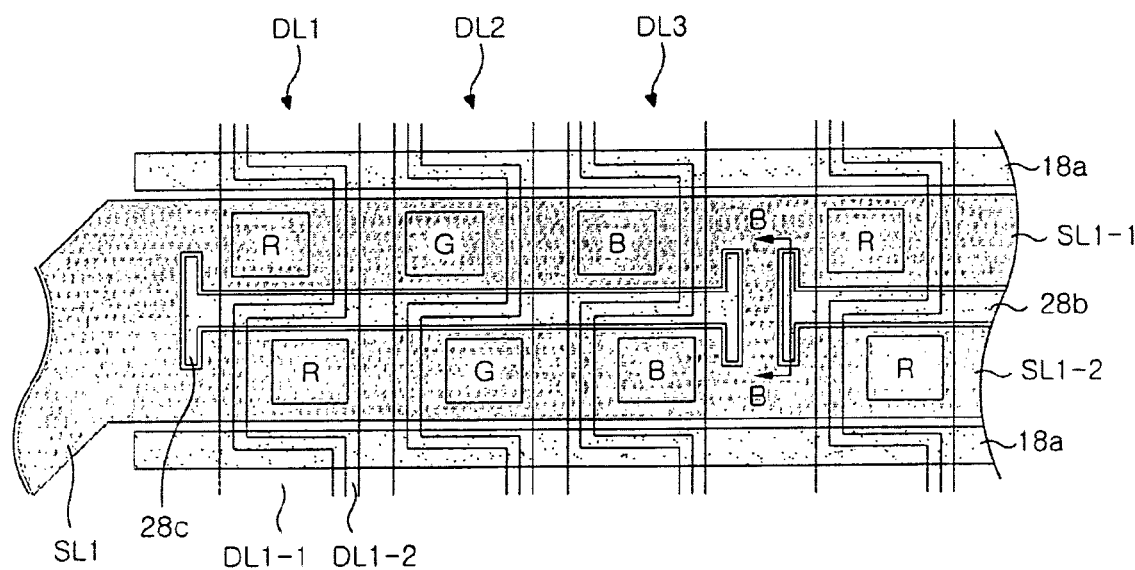
FIG. 7a is a detailed view of section "B" of FIG. 4, in accordance with another embodiment of the invention.

FIG. 7a is a detailed view of section "B" of FIG. 4, in accordance with a second embodiment of the invention. Section "B" of the organic EL display device includes anode columns DL1, DL2 and DL3, a cathode SL1 which crosses the anode columns DL1, DL2 and DL3, and primary walls 18a and a secondary wall 28b which cross the anode columns DL1, DL2 and DL3 and are positioned parallel to the cathode SL1.

A section of the cathode SL1, such as, for example, a section corresponding to an active region, may be divided into first and second sub cathodes SL1-1 and SL1-2 by the secondary wall 28b, forming two individual cells at an area common to one anode column (for example, DL1) and one cathode SL1. Also, although the primary walls 18a may extend to the non display region, the secondary wall 28b may be positioned only in a cell array area.

Figure 7B:
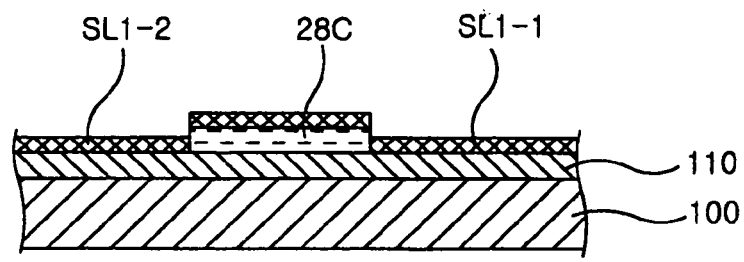

The secondary wall 28b which divides the cathode SL1 may actually be a plurality of unit secondary walls 28b, each unit secondary wall 28b corresponding to the first, second and third sub-pixels (EL cells) R, G and B, respectively, which make up one pixel. Each unit of the secondary walls 28b shown in FIG. 7 may also include at least one extension portion 28c formed on at least one end thereof which may be positioned parallel to the anode columns DL1-DL3, or may include an extension portion 28c formed at each end of each unit secondary wall 28b, as shown in FIG. 7a. FIG. 7b provides a partial sectional view of the extension portion 28c taken along line B-B of FIG. 7a.

When constructed in this manner, the first and second sub cathodes SL1-1 and SL1-2 may be connected to each other, for example, at an area between adjacent unit secondary walls 28b. These areas which connect the first and second sub cathodes SL1-1 and SL1-2 cause the first and second sub cathodes SL1-1 and SL1-2 to have a larger surface area, thus reducing the resistance of the sub cathodes SL1-1 and SL1-2. Also, the extension portions 28c which extend from each unit secondary wall 28b reduces interference generated between adjacent pixels when the EL cells emit light, thus enhancing an image displayed on the organic EL display panel.

Figure 8:
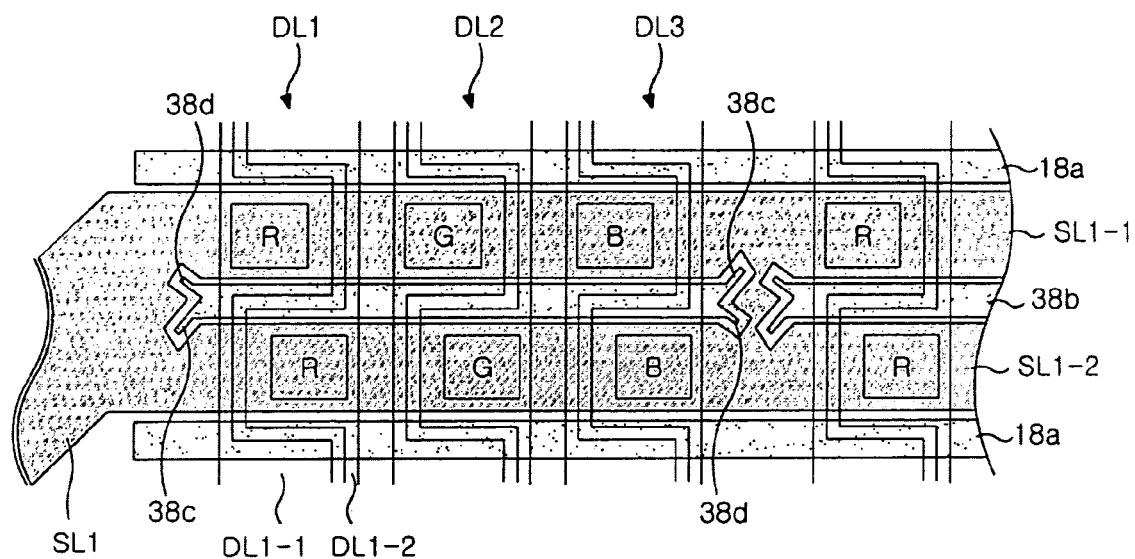
FIG. 8 is a detailed view of section "B" of FIG. 4, in accordance with another embodiment of the invention.

FIG. 8 is a detailed view of section "B" of FIG. 4, in accordance with a third embodiment of the invention.

Figure 6:
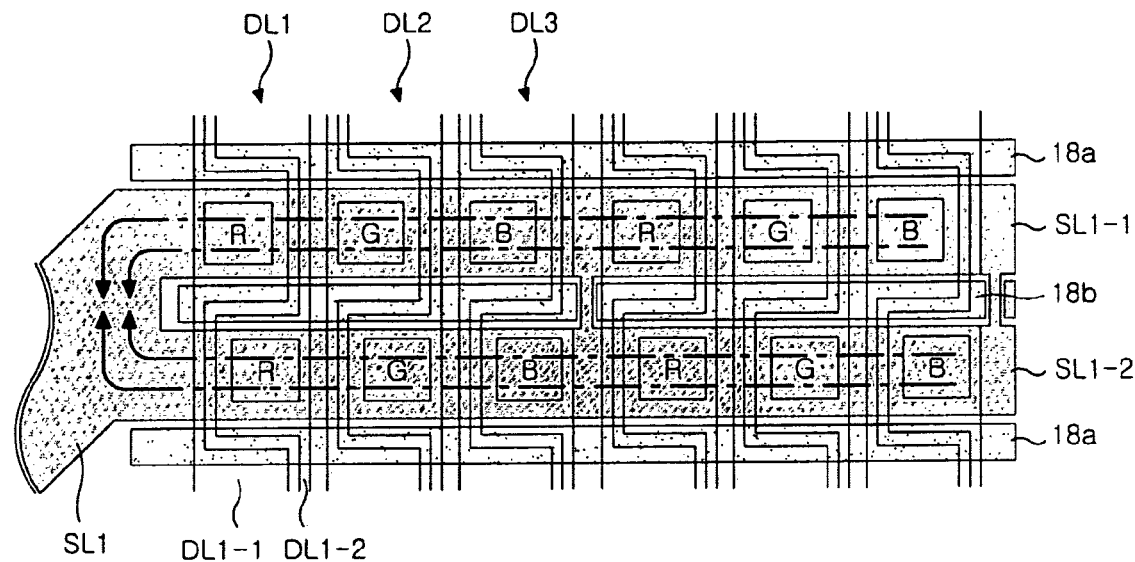
FIG. 6 illustrates a current path formed in the organic EL display device, in accordance with an embodiment of the invention.

The structure of the organic EL display device shown in FIG. 8 is similar to that shown in FIG. 6. However, the secondary wall 38b shown in FIG. 8 includes a first extension portion 38c and a second extension portion 38d formed on at least one end of each unit secondary wall 38b, oriented at a predetermined angle relative to the anode columns DL1 and DL2. In certain embodiments of the invention, the first extension portion 38c may be longer than the second extension portion 38d, and the first extension portion 38c of each unit secondary wall 38b may be adjacent to the second extension portion 38d, and parallel to a first extension portion 38c of an adjacent unit secondary wall 38b. Likewise, the second extension portion 38d of each unit secondary wall 38b may be adjacent to the first extension portion 38c, and parallel to a the second extension portion 38d of an adjacent unit secondary wall 38b.

Figure 9:
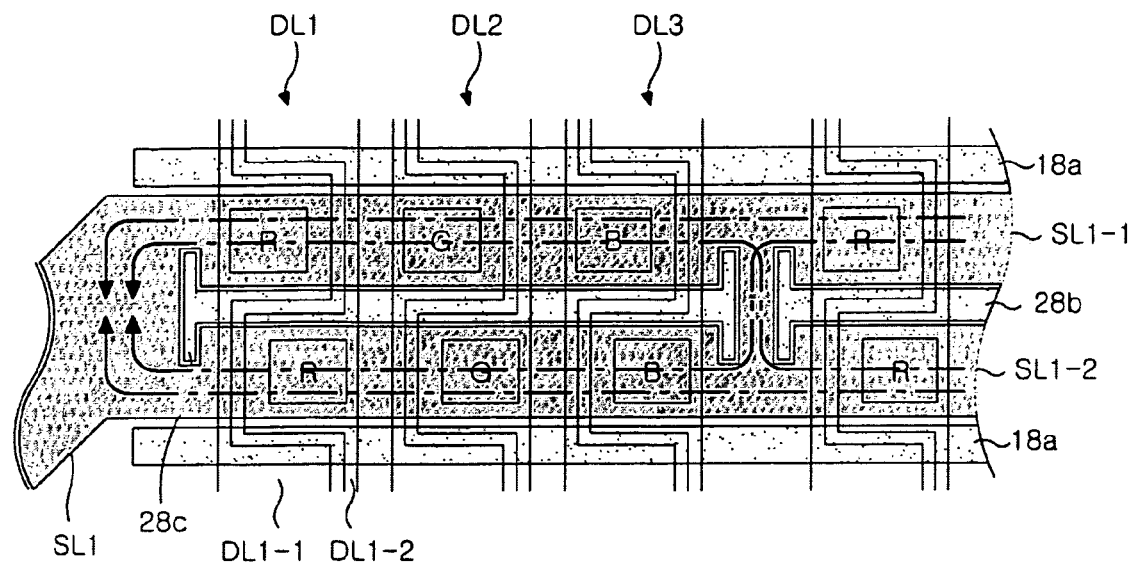
FIG. 9 illustrates a current path formed in the organic EL display device, in accordance with embodiments of the invention.

When constructed as described above, the first and second sub cathodes SL1-1 and SL1-2 may be coupled to each other, for example, at a region between adjacent unit secondary walls 38b. These areas which connect the first and second sub cathodes SL1-1 and SL1-2 cause the first and second sub cathodes SL1-1 and SL1-2 to have a larger surface area, thus reducing the resistance of the first and second sub cathodes SL1-1 and SL1-2. Also, the extension portions 38c and 38d formed at one end or both ends thereof may reduce interference generated between adjacent pixels when the EL cells emit light, thus producing an enhanced image on the organic EL display panel In the organic EL device in accordance with the second and third embodiments of the invention, current supplied to the first and second sub cathodes SL1-1 and SL1-2 through the anode may flow to the cathode SL1 via the current path shown in FIG. 9 so that power consumption of the organic EL display device may be decreased.

Figure 10:
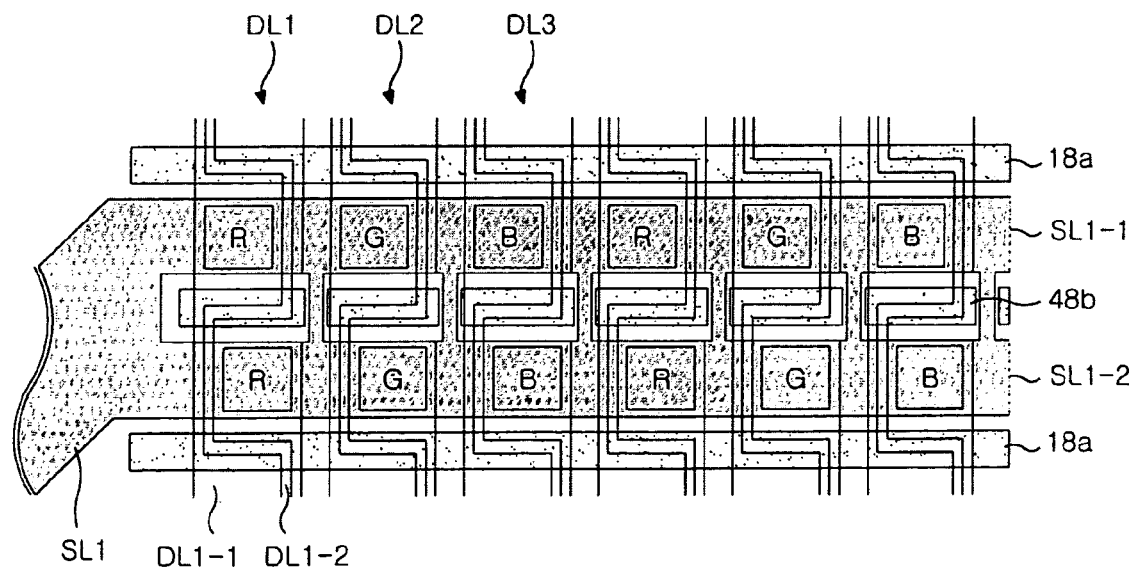
FIG. 10 is a detailed view of section "B" of FIG. 4, in accordance with another embodiment of the invention.

FIG. 10 is a detailed view of section "B" of FIG. 4, in accordance with a fourth embodiment of the invention. Section "B" of the organic EL display device includes anode columns D1, D2 and D3, a cathode SL1 which crosses the anode columns D1, D2 and D3, and primary walls 18a and a secondary wall 48b which cross the anode columns D1, D2 and D3 and are positioned parallel to the cathode SL1.

A section of the cathode SL1 such as, for example, a section corresponding to an active region may be divided into first and second sub cathodes SL1-1 and SL1-2 by the secondary wall 48b, forming two individual cells at an area common to one anode column, such as, for example, DL1 and one cathode, such as, for example, SL1. Also, although the primary walls 18a may extend to a non display region, the secondary wall 48b may be positioned only in a cell array region. The secondary wall 48b, which divides the cathode SL1 may actually be a plurality of unit secondary walls 48b, each unit secondary wall 48b corresponding to each of the first, second and third sub-pixels (EL cells) R, G and B, respectively, which make up one pixel.

Figure 11:
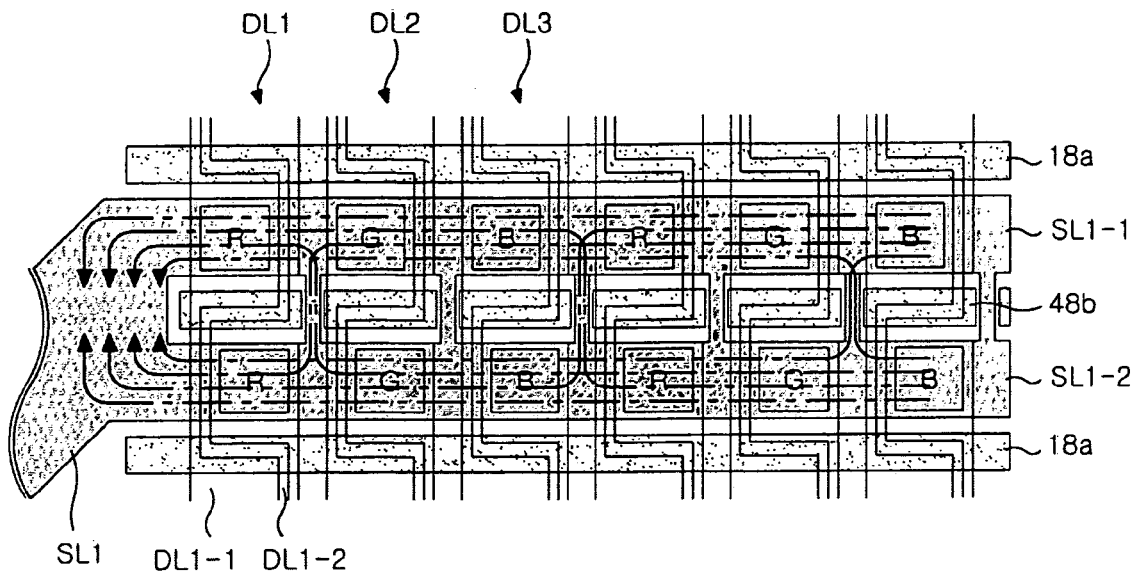
FIG. 11 illustrates a current path formed in the organic EL display device, in accordance with an embodiment of the invention.

When constructed in this manner, the first and second sub cathodes SL1-1 and SL1-2 may be coupled to each other, for example, at an area between adjacent unit secondary walls 48b. These areas which connect the first and second sub cathodes SL1-1 and SL1-2 cause the first and second sub cathodes SL1-1 and SL1-2 have a larger surface area, thus reducing the resistance of the sub cathodes SL1-1 and SL1-2. The current supplied to the first and second sub cathodes SL1-1 and SL1-2 through the anode flows easily to the cathode SL1 via the current path shown in FIG. 11 so that power consumption of the organic EL display device may be decreased.

Figure 12:
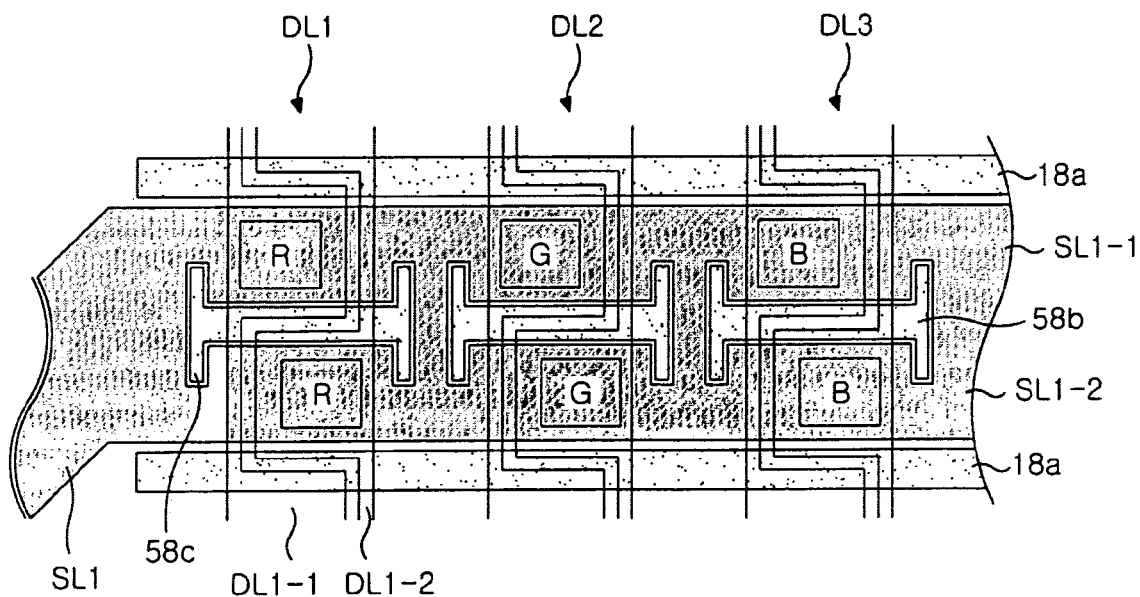
FIG. 12 is a detailed view of section "B" of FIG. 4, in accordance with another embodiment of the invention.

FIG. 12 is a detailed view of section "B" of FIG. 4, in accordance with a fifth embodiment of the invention. The structure of the organic EL display device shown in FIG. 12 is similar to that shown in FIG. 10. However, each unit secondary wall 58b shown in FIG. 12 includes an extension portion 58c formed on at least one end thereof, and each unit secondary wall 58b corresponds to one sub-pixel. The extension portion 58c may extend parallel to the anode columns DL1, DL2 and DL3 on just one end of each unit secondary wall 58b, or alternatively, an extension portion 58c may be formed on each end of each unit secondary wall 58b, as shown in FIG. 12.

When constructed in this manner, the first and second sub cathodes SL1-1 and SL1-2 may be coupled to each other, for example, at an area between adjacent unit secondary walls 58b. These areas which connect the first and second sub cathodes SL1-1 and SL1-2 cause the first and second sub cathodes SL1-1 and SL1-2 to have a larger surface area, thus reducing the resistance of the sub cathodes. Also, the extension portions 58c formed at one end or both ends thereof may reduce interference generated between adjacent sub-pixels (such as, for example, R and G, G and B) when the EL cells emit light, thus producing an enhanced image on the organic EL display panel.

Figure 13:
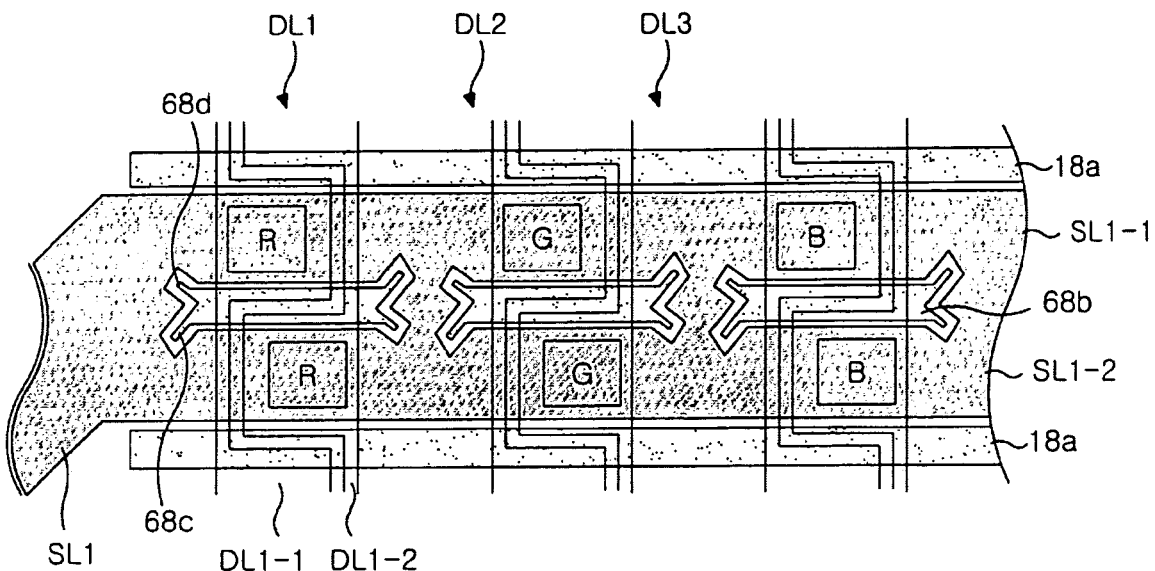
FIG. 13 is a detailed view of section "B" of FIG. 4, in accordance with another embodiment of the invention.

FIG. 13 is a detailed view of section "B" of FIG. 4, in accordance with a sixth embodiment of the invention. The structure of the organic EL display device shown in FIG. 13 is similar to that of the organic EL device shown in FIG. 10. However, each unit secondary wall 68b includes extension portions 68c and 68d are formed on at least one end thereof, and each unit secondary wall 68b corresponds to a single sub-pixel. The first and second extension portions 68c and 68d may extend at a predetermined angle relative to the anode columns DL1 and DL2, as shown in FIG. 13.

The first extension portion 68c may be longer than the second extension portion 68d. Also, the first extension portion 68c of each unit secondary wall 68b may be adjacent to the second extension portion 68d, and parallel to a first extension portion 68c of an adjacent unit secondary wall 68b.

Likewise, the second extension portion 68d of each unit secondary wall 68b may be adjacent to the first extension portion 68c, and parallel to a second extension portion 68d of an adjacent unit secondary wall 68b.

When constructed as described above, the first and second sub cathodes SL1-1 and SL1-2 may be coupled to each other, for example, at an area between adjacent unit secondary walls 68b. These areas which connect the first and second sub cathodes SL1-1 and SL1-2 cause the first and second sub cathodes SL1-1 and SL1-2 to have a larger surface area, thus reducing the resistance of the sub cathodes. Also, the extension portions 68c and 68d at one end or both ends thereof may reduce interference generated between adjacent sub-pixels when the EL cells emit light, thus producing an enhanced image on the organic EL display panel.

Figure 14:
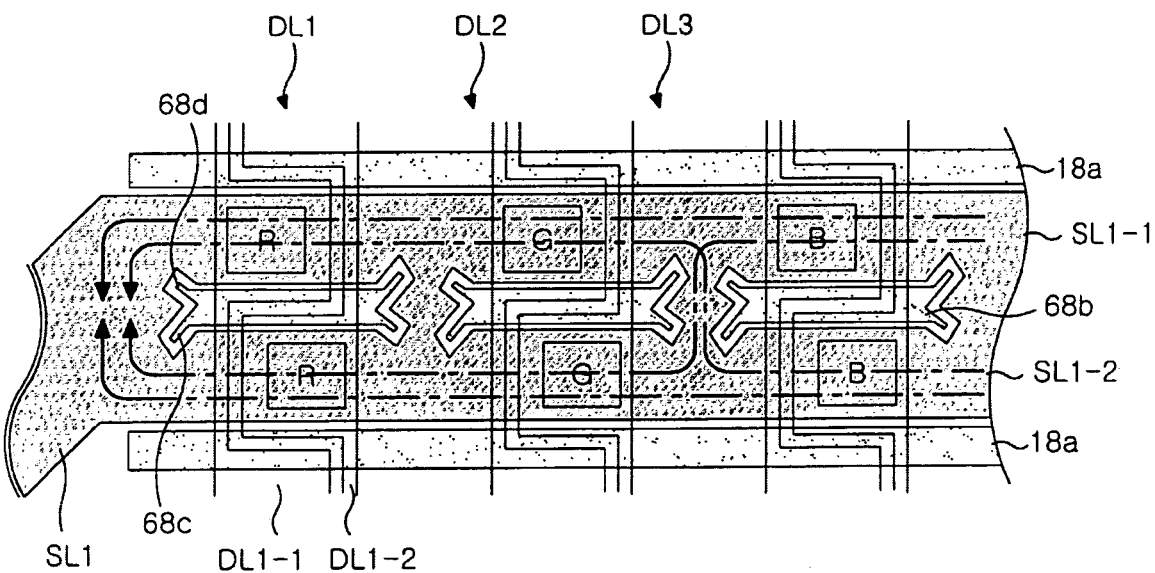
FIG. 14 illustrates a current path formed in the organic electroluminescent display device, in accordance with embodiments of the invention.

In the organic EL devices in accordance with the fifth and sixth embodiments of the invention, current supplied to the first and second sub cathodes SL1-1 and SL1-2 through the anode can flow to the cathode SL1 via the current path shown in FIG. 14 so that power consumption of the organic EL display device may be decreased.

The electroluminescent device of the present invention may be used in or formed as a flexible display for numerous devices, such as, for example, electronic books, newspapers, magazines, and the like, different types of portable devices, such as, for example, handsets, MP3 players, notebook computers, and the like, audio applications, navigation applications, televisions, monitors, or other types of devices using a display, either monochrome or color.

In an organic EL device as embodied and broadly described herein, each cathode may be divided in an active region by a secondary wall into two sub cathodes, and the two sub cathodes may be connected to each other at an area between adjacent unit secondary walls so increase surface area of the cathode formed on the emitting area. In this manner, resistance of the cathode may be reduced so that power consumption of the organic EL device may be decreased.

Additionally, extensions formed at the end(s) of each unit secondary wall and extending parallel to or at a predetermined angle to the anodes may reduce interference between adjacent pixels or sub-pixels so that image quality of the organic EL device may be enhanced.

The foregoing embodiments and advantages are merely exemplary and are not to be construed as limiting the present invention. The present teaching can be readily applied to other types of apparatuses. The description of the present invention is intended to be illustrative, and not limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. An electroluminescent device, comprising:
   a plurality of anode columns provided on a substrate, each anode column comprising a first anode and a second anode, wherein the first and second anodes are disposed adjacent to each other such that respective emitting areas of the first and second anodes are arranged alternately along a respective anode column;
   a plurality of primary walls positioned substantially perpendicular to the plurality of anode columns;
   a plurality of cathodes, wherein a cathode is provided between two of the first walls so as to contact the respective emitting areas of the first and second anodes; and
   a plurality of secondary walls positioned between two adjacent primary walls and arranged in parallel with the two adjacent primary walls.

2. The device of claim 1, wherein the plurality of secondary walls are positioned between respective emitting areas of the first and second anodes of each anode column.

3. The device of claim 1, wherein the plurality of secondary walls are positioned in a row direction of the device.

4. The device of claim 1, wherein the plurality of secondary walls are each shorter in length than the plurality of primary walls.

5. The device of claim 1, wherein the plurality of secondary walls are configured to separate at least one first row sub-pixel from a corresponding at least one second row sub-pixel positioned between two primary walls.

6. The device of claim 5, wherein each of the plurality of cathodes comprises at least one connection portion which extends from the at least one first row sub-pixel to the at least one second row sub-pixel in a space formed between adjacent secondary walls.

7. The device of claim 6, wherein each of the plurality of secondary walls extends along a length of a pixel, and wherein a connection portion is formed between each set of adjacent pixels in a row of the device.

8. The device of claim 6, wherein each of the plurality of secondary walls extends along a length of one sub-pixel, and wherein a connection portion is formed between each set of adjacent sub-pixels in a row of the device.

9. The device of claim 5, wherein each of the plurality of secondary walls comprises an extension portion formed at least one end thereof.

10. The device of claim 9, wherein each extension portion is configured to inhibit interference between adjacent pixels.

11. The device of claim 9, wherein each extension portion is configured to inhibit interference between adjacent sub-pixels.

12. The device of claim 9, wherein each extension portion comprises first and second extension portions which extend from the at least one end of its respective secondary wall.

13. The device of claim 12, wherein each of the first and second extension portions extends at a predetermined angle from its respective secondary wall.

14. The device of claim 13, wherein each secondary wall comprises an extension portion formed at each end thereof.

15. The device of claim 14, wherein the first extension portions of each secondary wall extend parallel to one another, and the second extension portions of each secondary wall extend parallel to one another.

16. The device of claim 15, wherein the first and second extension portions of each secondary wall are non-parallel.

17. The device of claim 15, wherein the first extension portion is longer than the second extension portion.

18. The device of claim 13, wherein each of the first and second extension portions extends substantially perpendicular to its respective secondary wall.

19. The device of claim 1, wherein the device is an organic electroluminescent device.

20. An electroluminescent device, comprising:
a plurality of first row pixels having a first cathode;
a plurality of second row pixels having a second cathode;
a first primary wall positioned adjacent to the plurality of first row pixels;
a second primary wall positioned adjacent to the plurality of second row pixels;
a plurality of secondary walls formed between the plurality of first row pixels and the plurality of second row pixels and arranged in parallel with the plurality of first row pixels and the plurality of second row pixels, wherein the first and second cathodes are coupled between spaces formed between adjacent secondary walls.

21. The device of claim 20, wherein each of the plurality of a secondary walls extends along a length of a first row and corresponding second row pixel such that the first and second cathodes are coupled between spaces formed between adjacent secondary walls which extend between adjacent pixels.

22. The device of claim 21, wherein each of the plurality of a secondary walls comprises an extension portion formed at each end thereof which is configured to inhibit interference between adjacent pixels.

23. The device of claim 22, wherein each extension portion comprises first and second extension portions which extend at a predetermined angle from each end of a respective secondary wall.

24. The device of claim 23, wherein the first extension portions of each secondary wall extend parallel to one another, and the second extension portions of each secondary wall extend parallel to one another.

25. The device of claim 24, wherein the first and second extension portions of each secondary wall are non-parallel.

26. The device of claim 25, wherein the first extension portion is longer than the second extension portion.

27. The device of claim 23, wherein each of the first and second extension portions extends substantially perpendicular to its respective secondary wall.

28. The device of claim 20, wherein the plurality of secondary walls are each positioned in a row direction of the device.

29. The device of claim 20, wherein the plurality of secondary walls are each shorter in length than the first and second primary walls.

30. The device of claim 20, wherein each of the plurality first row pixels comprises a plurality of first row sub-pixels, and each of the plurality of second row pixels comprises a plurality of second row sub-pixels, and wherein each of the plurality of secondary walls extends along a length of a first row and corresponding second row sub-pixel such that the first and second cathodes are coupled between spaces formed between adjacent walls which extend between adjacent sub-pixels.

31. The device of claim 30, wherein each of the plurality of secondary walls comprise an extension portion formed at each end thereof which is configured to inhibit interference between adjacent sub-pixels.

32. The device of claim 31, wherein each extension portion comprises first and second extension portions which extend at a predetermined angle from each end of a respective secondary wall.

33. The device of claim 32, wherein the first extension portions of each secondary wall extend parallel to one another, the second extension portions of each secondary wall extend parallel to one another, and the first and second extension portions of each secondary wall are non-parallel.

34. The device of claim 33, wherein the first extension portion is longer than the second extension portion.

35. The device of claim 32, wherein each of the first and second extension portions extends substantially perpendicular to its respective secondary wall.

36. The device of claim 20, wherein the device is an organic electroluminescent device.

37. The device of claim 20, wherein the first and second cathode are commonly coupled to a scan line.

38. The device of claim 37, wherein the first and second cathode are commonly coupled to a scan line at an end or each of the first and second cathodes.

39. An electroluminescent device, comprising:
a plurality of rows pixels, each pixel comprising a plurality of first row sub-pixels and a corresponding plurality of second row sub-pixels;
a plurality of primary walls positioned substantially parallel to the plurality of rows of pixels; and
a plurality of cathodes, each cathode being positioned between two primary walls, with a first portion thereof extending along a corresponding plurality of first row sub-pixels and a second portion thereof extending along a corresponding plurality of second row sub-pixels, and wherein each cathode includes at least one connection portion which extends between the first and second portions of the cathode.

* * * * *